(12) United States Patent
Fan

(10) Patent No.: US 11,404,584 B2
(45) Date of Patent: Aug. 2, 2022

(54) ARRAY SUBSTRATE AND METHOD OF PREPARING THE SAME

(71) Applicant: WUHAN CHINA STAR OPTOELECTRONICS SEMICONDUCTOR DISPLAY TECHNOLOGY CO., LTD., Hubei (CN)

(72) Inventor: Chengjun Fan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 195 days.

(21) Appl. No.: 16/644,254

(22) PCT Filed: Nov. 22, 2019

(86) PCT No.: PCT/CN2019/120277
§ 371 (c)(1),
(2) Date: Mar. 4, 2020

(87) PCT Pub. No.: WO2021/027176
PCT Pub. Date: Feb. 18, 2021

(65) Prior Publication Data
US 2021/0288185 A1    Sep. 16, 2021

(30) Foreign Application Priority Data
Aug. 13, 2019  (CN) .......................... 201910743565.1

(51) Int. Cl.
*H01L 29/786* (2006.01)
*H01L 29/66* (2006.01)
(Continued)

(52) U.S. Cl.
CPC .. *H01L 29/78678* (2013.01); *H01L 21/02667* (2013.01); *H01L 29/458* (2013.01); *H01L 29/66765* (2013.01)

(58) Field of Classification Search
CPC ......... H01L 29/78678; H01L 21/02667; H01L 29/458; H01L 29/66765; H01L 29/0653;
(Continued)

(56) References Cited

U.S. PATENT DOCUMENTS

2008/0303030 A1* 12/2008 Sakai ................ H01L 29/66765
257/72
2015/0179811 A1   6/2015 Kanno et al.
(Continued)

FOREIGN PATENT DOCUMENTS

| CN | 104350600 A | 2/2015 |
| CN | 107564966 A | 1/2018 |

*Primary Examiner* — David Vu
(74) *Attorney, Agent, or Firm* — Hamre, Schumann, Mueller & Larson, P.C.

(57) ABSTRACT

The present disclosure provides an array substrate and a method of preparing the same. The array substrate includes a substrate, a gate, a gate insulation layer, an active layer, a crystallization layer, an oxide layer, a source/drain metal layer, and a passivation layer. After the crystallization layer is prepared, a mask plate is not removed and is used to protect an upper surface of the crystallization layer from oxidation reaction. Then, an oxide layer is formed on sidewalls of the crystallization layer and the active layer. The oxide layer is used to obstruct the source/drain metal layer from contacting the active layer. The source/drain metal layer is only in contact with the crystallization layer, thereby reducing a path of leakage current and achieving a purpose of reducing the leakage current.

6 Claims, 2 Drawing Sheets

(51) Int. Cl.
*H01L 21/02* (2006.01)
*H01L 29/45* (2006.01)

(58) Field of Classification Search
CPC ............... H01L 27/1222; H01L 27/127; H01L 29/0638; H01L 29/78609
See application file for complete search history.

(56) References Cited

U.S. PATENT DOCUMENTS

2017/0154773 A1 6/2017 Zhou et al.
2019/0043994 A1 2/2019 Li

\* cited by examiner

ARRAY SUBSTRATE AND METHOD OF PREPARING THE SAME

FIELD OF THE INVENTION

The present disclosure relates to the technical field of displays, and specifically to an array substrate and a method of preparing the same.

BACKGROUND OF THE INVENTION

Low temperature poly-silicon (LTPS) technology has advantages, such as high electron mobility, better sub-threshold swing, large on/off states current ratio, low power consumption, high pixel density, and being able to apply to flexible organic light-emitting diode (OLED) substrates, and has attracted widespread attention in recent years. However, excimer laser annealing (ELA) technology is adopted in conventional LTPS production for crystallization, in which machines are expensive and production cost is high. Moreover, a case of uneven brightness is easily generated during crystallization by the ELA technology due to poor uniformity, so that large-sized display panels cannot be produced. In addition, since solid phase crystallization (SPC) technology has advantages, such as low cost and better crystallization uniformity, in which implanting a certain amount of boron ions before crystallization can greatly reduce the temperature and time required for crystallization. This new type of SPC crystallization technology has started to attract attention in the industry.

As shown in FIG. 1, in a bottom-gated structure in the prior art, a contact between a source/drain metal layer 11 and an amorphous silicon material in a lower semiconductor layer 12 will increase a path of leakage current, to raise the leakage current, and affect characteristics of a thin film transistor (TFT).

Therefore, there is an urgent need to provide a new array substrate and a method of preparing the same, which are used to avoid a contact between the source/drain metal layer and an active layer, thereby reducing the leakage current.

SUMMARY OF THE INVENTION

An object of the present disclosure is to provide an array substrate and a method of preparing the same, by forming an oxide layer on sidewalls of the active layer and the crystallization layer, the oxide layer is used to obstruct the source/drain metal layer from contacting the active layer, thereby reducing a path of leakage current and achieving a purpose of reducing the leakage current.

In order to achieve the above object, the present disclosure provides an array substrate, which includes a substrate; a gate disposed on the substrate; a gate insulation layer disposed on the gate and the substrate; an active layer disposed on a side of the gate insulation layer away from the gate; a crystallization layer disposed on a side of the active layer away from the gate insulation layer; an oxide layer disposed on two sides of each of the active layer and the crystallization layer; a source/drain metal layer disposed over the gate and the crystallization layer, wherein the source/drain metal layer covers the oxide layer and is provided with a through hole passing through the source/drain metal layer, the crystallization layer, and a part of the active layer; and a passivation layer disposed over the source/drain metal layer and the gate and provided in the through hole.

Further, material of the oxide layer includes silicon oxide.

Further, material of the crystallization layer includes polysilicon and boron; and material of the active layer includes polysilicon.

Further, the source/drain metal layer includes: a first metal layer; a second metal layer disposed on the first metal layer; and a third metal layer disposed on a side of the second metal layer away from the first metal layer.

Further, the through hole is formed into a groove that is located at the active layer and the crystallization layer.

Further, material of the passivation layer includes silicon oxide.

Further, material of each of the first metal layer and the third metal layer includes molybdenum; and material of the second metal layer includes aluminum and copper.

Further, the source/drain metal layer has a source wiring structure and a drain wiring structure, wherein the source wiring structure and the drain wiring structure are connected to the crystallization layer.

The present disclosure further provides a method of preparing an array substrate, which includes steps of: providing a substrate; depositing a gate on the substrate; depositing a gate insulation layer on the substrate and the gate; depositing an amorphous silicon material that is formed as an active layer provided with amorphous silicon over the gate, implanting boron into a surface of the amorphous silicon material, and rapidly heating the amorphous silicon material to crystallize a crystallization layer; disposing a mask plate on the crystallization layer and forming a corresponding pattern by exposure and development; performing a plasma process on sidewalls of the active layer and the crystallization layer to form an oxide layer; removing the mask plate and depositing a source/drain metal layer over the gate and the crystallization layer; patterning the source/drain metal layer to form a source wiring structure and a drain wiring structure, wherein a gap is between the source wiring structure and the drain wiring structure; etching the crystallization layer at the gap to form a groove; and depositing a passivation layer over the gate insulation layer and the source/drain metal layer, wherein the passivation layer fills the groove.

Further, in the step of rapidly heating the amorphous silicon material to crystallize the crystallization layer, temperature of heating ranges from 600 to 650 degrees Celsius and time of heating ranges from 10 to 20 minutes.

The present disclosure provides an array substrate and a method of preparing the same. After the crystallization layer is prepared, the mask plate is not removed and is used to protect an upper surface of the crystallization layer from oxidation reaction. By forming an oxide layer on sidewalls of the active layer and the crystallization layer, the oxide layer is used to obstruct the source/drain metal layer from contacting the active layer. The source/drain metal layer is only in contact with the crystallization layer, thereby reducing a path of leakage current and achieving a purpose of reducing the leakage current.

BRIEF DESCRIPTION OF THE DRAWINGS

In order to explain technical solutions in embodiments of the present disclosure more clearly, the drawings used in a description of the embodiments are briefly introduced below. Obviously, the drawings in the following description are only some embodiments of the present disclosure. For those skilled in the art, other drawings can be obtained based on these drawings without paying creative labor.

Figure 1:
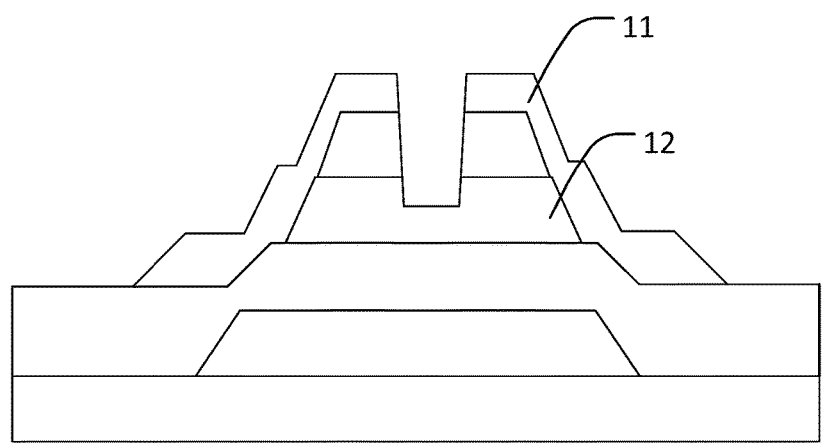
FIG. 1 is a schematic structural diagram illustrating an array substrate in the prior art.

100: array substrate;
101: substrate; 102: gate; 109: gate insulation layer;
103: active layer; 104: crystallization layer; 105: oxide layer;
106: source/drain metal layer; 107: passivation layer; 110: through hole;
120: mask plate; 130: gap; 140: groove;
1061: source wiring structure; 1062: drain wiring structure.

DETAILED DESCRIPTION OF PREFERRED EMBODIMENTS

A description of each embodiment with reference to accompanying drawings is as follows to illustrate specific embodiments in which the present disclosure can be implemented. Directional terms mentioned in the present disclosure, such as "up", "down", "front", "back", "left", "right", "inner", "outer", and "side", are only used for directions referring to the drawings. Names of components mentioned in the present disclosure, such as "first" and "second", are only used to distinguish different components, which can be better expressed. In the drawings, similarly structural units are indicated by the same reference numerals.

Embodiments of the present disclosure will be described in detail herein with reference to the accompanying drawings. The disclosure may be implemented in many different forms and should not be construed as being limited to specific embodiments set forth herein. The embodiments of the present disclosure are provided to explain the practical application of the present disclosure, thereby that those skilled in the art can understand various embodiments of the present disclosure and various modifications suitable for a specific intended application.

Figure 2:
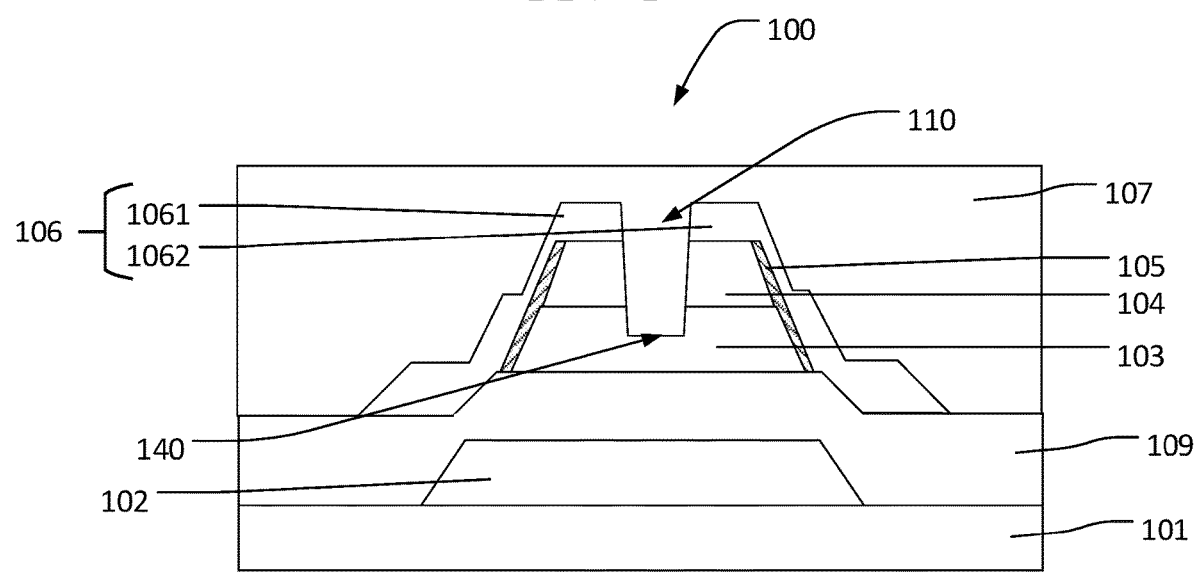
FIG. 2 is a schematic structural diagram illustrating an array substrate provided by the present disclosure.

As shown in FIG. 2, the present disclosure provides an array substrate 100, which includes a substrate 101, a gate 102, a gate insulation layer 109, an active layer 103, a crystallization layer 104, an oxide layer 105, a source/drain metal layer 106, and a passivation layer 107.

A material of the substrate 101 is Polyimide, which is used to make the substrate 101 flexible.

The gate 102 is disposed on the substrate 101. The gate insulation layer 109 is disposed on the gate 102 and the substrate 101.

The active layer 103 is disposed on a side of the gate insulation layer 109 away from the gate 102, wherein material of the active layer 103 includes polysilicon.

The crystallization layer 104 is disposed on a side of the active layer 103 away from the gate insulation layer 109, wherein material of the crystallization layer 104 includes polysilicon and boron.

The oxide layer 105 is disposed on two sides of each of the active layer 103 and the crystallization layer 104, wherein material of the oxide layer 105 includes silicon oxide.

The source/drain metal layer 106 is disposed over the gate 102 and the crystallization layer 104, wherein the source/drain metal layer 106 covers the oxide layer 105 and is provided with a through hole 110 passing through the source/drain metal layer 106, the crystallization layer 104, and a part of the active layer 103.

The through hole 110 is formed into a groove 140 that is located at the active layer 103 and the crystallization layer 104. The passivation layer 107 is configured to protect the groove 140.

The oxide layer 105 is configured to obstruct the source/drain metal layer 106 from contacting the active layer 103. The source/drain metal layer 106 is only in contact with the crystallization layer 104, thereby reducing a path of leakage current and achieving a purpose of reducing the leakage current.

The source/drain metal layer 106 includes a first metal layer, a second metal layer, and a third metal layer.

Material of the first metal layer includes molybdenum. In addition, the second metal layer is disposed on the first metal layer, wherein material of the second metal layer includes aluminum and copper. In addition, material of the third metal layer includes molybdenum.

The source/drain metal layer 106 has a source wiring structure 1061 and a drain wiring structure 1062, wherein the source wiring structure 1061 and the drain wiring structure 1062 are connected to the crystallization layer 104.

The passivation layer 107 is disposed over the source/drain metal layer 106 and the gate 102 and is provided in the through hole 110, wherein material of the passivation layer 107 includes silicon oxide.

The present disclosure provides an array substrate 100, by providing an oxide layer 105 on sidewalls of the crystallization layer 104 and the oxide layer 103, the oxide layer 105 is used to obstruct the source/drain metal layer 106 from contacting the active layer 103. The source/drain metal layer 106 is only in contact with the crystallization layer 104, thereby reducing a path of leakage current and achieving a purpose of reducing the leakage current.

The present disclosure further provides a method of preparing an array substrate, which includes steps S1 to S10.

In the step S1, that is configured for providing a substrate 101, wherein material of the substrate 101 is Polyimide, which is configured to make the substrate 101 flexible.

In the step S2, that is configured for depositing a gate 102 on the substrate 101.

In the step S3, that is configured for depositing a gate insulation layer 109 on the substrate 101 and the gate 102.

In the step S4, that is configured for depositing an amorphous silicon material that is formed as an active layer 103 provided with amorphous silicon over the gate 102, implanting boron into a surface of the amorphous silicon material, and rapidly heating the amorphous silicon material to crystallize a crystallization layer 104.

In the step of rapidly heating the amorphous silicon material to crystallize the crystallization layer 104, temperature of heating ranges from 600 to 650 degrees Celsius and time of heating ranges from 10 to 20 minutes.

Figure 3:
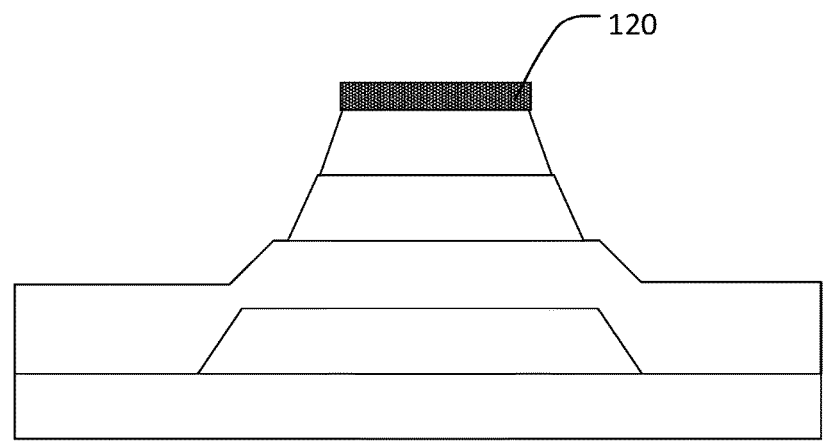
FIG. 3 is a schematic structural diagram illustrating a mask plate provided by the present disclosure.

In the step S5, that is configured for disposing a mask plate 120 on the crystallization layer 104 and forming a corresponding pattern by exposure and development, as shown in FIG. 3. In addition, a material of the mask plate 120 is a photoresist material.

In the step S6, that does not remove the mask plate 120 and is configured for performing a plasma process on sidewalls of the active layer 103 and the crystallization layer 104 to form an oxide layer 105, in which oxidation reaction is mainly performed by oxygen with the crystallization layer 104 and the active layer 103. The mask plate 120 is also played a rule of protecting an upper surface of the crystal layer 104 during the oxidation reaction.

For the oxide layer 105 provided by the present disclosure, a new mask plate 120 does not need to manufacture, so as to save unnecessary expenses.

In the step S7, that is configured for removing the mask plate 120 and depositing a source/drain metal layer over the gate 102 and the crystallization layer 104.

Figure 4:
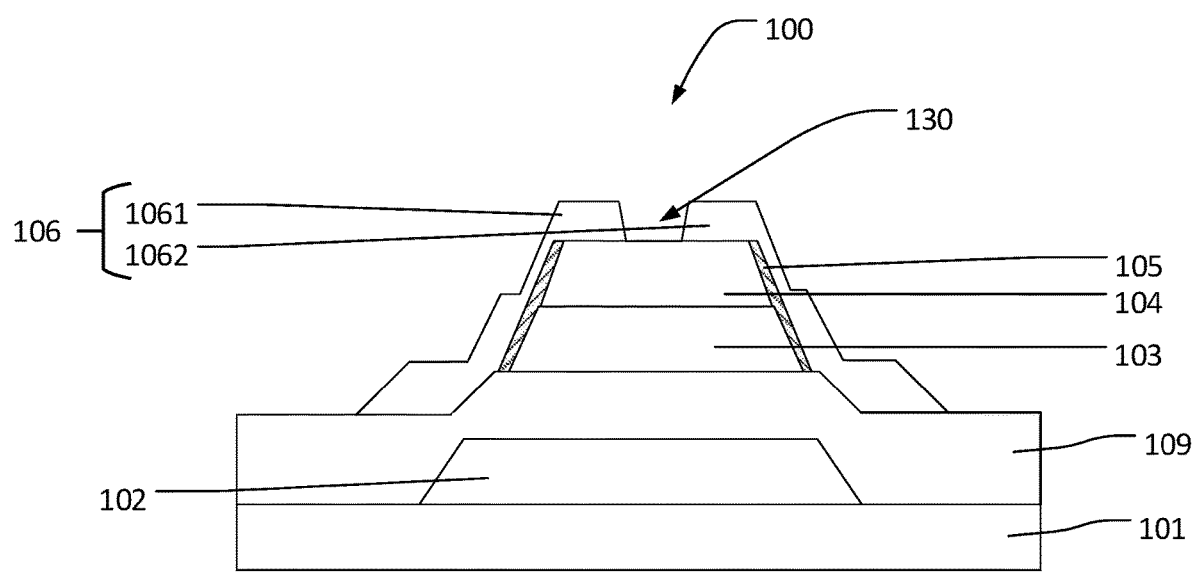
FIG. 4 is a schematic structural diagram illustrating a source wiring structure and a drain wiring structure provided by the present disclosure.

In the step S8, that is configured for patterning the source/drain metal layer 106 to form a source wiring structure 1061 and a drain wiring structure 1062, wherein a gap 130 is between the source wiring structure 1061 and the drain wiring structure 1062, as shown in FIG. 4.

In the step S9, that is configured for etching the crystallization layer 104 at the gap 130 to form a groove 140 (as shown in FIG. 2).

In the step S10, that is configured for depositing a passivation layer 107 over the gate insulation layer 109 and the source/drain metal layer 106, wherein the passivation layer 107 fills the groove 140.

The present disclosure further provides a method of preparing an array substrate. After the crystallization layer 104 is prepared, the mask plate 120 is not removed and is configured to protect the upper surface of the crystallization layer 104 from the oxidation reaction. In addition, by forming an oxide layer 105 on sidewalls of the crystallization layer 104 and the active layer 103, the oxide layer 105 is configured to obstruct the source/drain metal layer 106 from contacting the active layer 103. The source/drain metal layer 106 is only in contact with the crystallization layer 104, thereby reducing a path of leakage current and achieving a purpose of reducing the leakage current.

A technical scope of the present disclosure is not limited to the content in the description. Those skilled in the art can make various variations and modifications to the embodiment without departing from technical ideas of the present disclosure, and these variations and modifications should be within the scope of the present disclosure.

What is claimed is:

1. An array substrate, comprising:
  a substrate;
  a gate disposed on the substrate;
  a gate insulation layer disposed on the gate and the substrate;
  an active layer disposed on a side of the gate insulation layer away from the gate;
  a crystallization layer disposed on a side of the active layer away from the gate insulation layer;
  an oxide layer disposed on two sides of each of the active layer and the crystallization layer;
  a source/drain metal layer disposed over the gate and the crystallization layer, wherein the source/drain metal layer covers the oxide layer and is provided with a through hole passing through the source/drain metal layer, the crystallization layer, and a part of the active layer; and
  a passivation layer disposed over the source/drain metal layer and the gate and provided in the through hole;
  wherein the source/drain metal layer is composed of three stacked metal layers and specifically comprises a first metal layer, a second metal layer disposed on the first metal layer, and a third metal layer disposed on a side of the second metal layer away from the first metal layer; material of each of the first metal layer and the third metal layer comprises molybdenum; and material of the second metal layer comprises aluminum and copper.

2. The array substrate as claimed in claim 1, wherein material of the oxide layer comprises silicon oxide.

3. The array substrate as claimed in claim 1, wherein material of the crystallization layer comprises polysilicon and boron; and
  material of the active layer comprises polysilicon.

4. The array substrate as claimed in claim 1, wherein the through hole is formed into a groove that is located at the active layer and the crystallization layer.

5. The array substrate as claimed in claim 1, wherein material of the passivation layer comprises silicon oxide.

6. The array substrate as claimed in claim 1, wherein the source/drain metal layer has a source wiring structure and a drain wiring structure, and the source wiring structure and the drain wiring structure are connected to the crystallization layer.

* * * * *